United States Patent [19]
Naruse et al.

[11] Patent Number: 5,604,359
[45] Date of Patent: Feb. 18, 1997

[54] PARASITIC PNP TRANSISTOR WITH CRYSTAL DEFECT LAYER IN THE EMITTER REGION

[75] Inventors: Kazushi Naruse, Nara; Hiroaki Yamamoto, Tenri; Toshio Naka, Nabari; Katsuki Tsuda, Nara, all of Japan

[73] Assignee: Sharp Kabushiki Kaisha, Osaka, Japan

[21] Appl. No.: 185,517

[22] Filed: Jan. 24, 1994

[30] Foreign Application Priority Data

Jan. 28, 1993 [JP] Japan ................................. 5-012413
Apr. 14, 1993 [JP] Japan ................................. 5-087194

[51] Int. Cl.$^6$ ........................... H01L 29/76; H01L 27/108
[52] U.S. Cl. ................................. 257/69; 257/66; 257/67; 257/68; 257/296; 437/24; 437/35; 437/44
[58] Field of Search ............................. 257/66, 67, 68, 257/69, 296, 369; 437/24, 35, 44

[56] References Cited

U.S. PATENT DOCUMENTS

| | | | |
|---|---|---|---|
| 5,223,445 | 6/1993 | Fuse ........................................... | 437/24 |
| 5,237,187 | 8/1993 | Suwanai et al. ........................... | 257/296 |
| 5,244,820 | 9/1993 | Kamata et al. ............................. | 437/20 |
| 5,466,960 | 11/1995 | Ilderem et al. ........................... | 257/369 |

OTHER PUBLICATIONS

Wolf et al, Silicon Processing for the VLSI Era, vol. 1: Process Technology (Lattice Press, Sunset Beach, CA, 1986) p. 325.

*Primary Examiner*—Mahshid Saadat
*Assistant Examiner*—Valencia Martin Wallace
*Attorney, Agent, or Firm*—Nixon & Vanderhye P.C.

[57] ABSTRACT

A transistor comprising a P-type high concentration impurity diffusion layer which can also serve as an emitter for a parasitic PNP transistor wherein a layer of crystal defect obtained by ion implantation of inert impurity atoms or a compound thereof is arranged in the P-type high concentration impurity diffusion layer thereby decreasing the current amplification rate of the parasitic transistor.

17 Claims, 10 Drawing Sheets

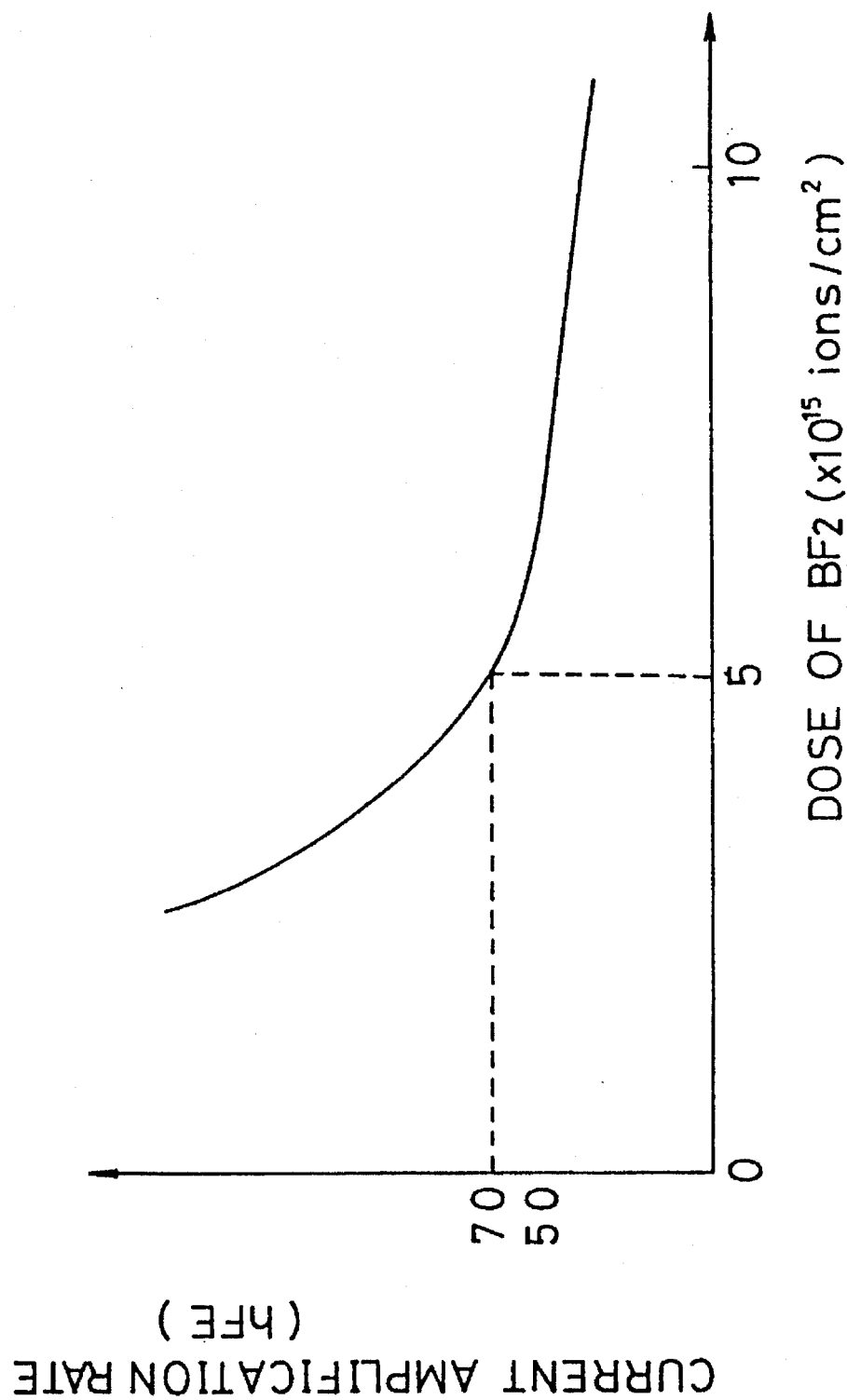

PARASITIC PNP TRANSISTOR WITH CRYSTAL DEFECT LAYER IN THE EMITTER REGION

BACKGROUND OF THE INVENTION

1. Field of the Invention

The present invention relates to a transistor. More particularly it relates to a transistor in which a parasitic transistor is formed in a transistor region, and still more particularly to an improvement of a vertical NPN transistor and a complementary transistor.

2. Description of the Related Art

Conventionally vertical NPN transistors of this kind are manufactured, for example, in the following process. At the outset, as shown in FIG. 8(a), in a predetermined region on the surface of a P-type semiconductor substrate 101, an $N^+$-type (a high impurity concentration N-type) buried layer 102 is provided and an N-type epitaxial layer 103 is formed on the entire surface thereof. Subsequently in a region surrounding the $N^+$-type buried layer 102 P-type impurity atoms are diffused into the N-type epitaxial layer 103 to form a $P^+$-type isolation diffusion layer 104 reaching the substrate 101. Then on the upper portion of the $N^+$-type buried layer 102 N-type impurity atoms are diffused to form an $N^+$-type diffusion layer 105. In the subsequent step, the $N^+$-type diffusion layer 105 is subjected to heat treatment, e.g. for 80 minutes at 900° C. in atmosphere of $H_2O$ thereby forming an oxide film 106 to a thickness of about 3000 Å. The N+-type diffusion layer 105, the $N^+$-type buried layer 102 and the N-type epitaxial layer 103 constitute an N-type collector layer.

Subsequently, as shown in FIG. 8(b), an opening 106a is bored on the upper portion over the $N^+$-type buried region 102 out of the oxide film 106. Through this opening 106a $^{11}$B ions (designated by Reference Numeral 107) are implanted to form a $P^-$-type (a low impurity concentration P-type) active base 108. Then as shown in FIG. 8(c), on the surface of the substrate, a resist 110 is applied, followed by performing photolithography to bore an opening 110a in a region corresponding to the periphery of the active base 108 out of the resist 110. Through this opening 110a $^{11}$B ions are implanted to form a $P^+$-type (a high impurity concentration P-type) external base 111 on the periphery of the active base 108 (incidentally out of the active base 108 a portion where $P^-$ type remains is referred to as an "internal base"). After removing the resist 110, as shown in FIG. 9(a), an oxide film 112 is formed on the opening 106a. Then as shown in FIG. 9(b), on a portion corresponding to a portion above the internal base 108a an opening 112a is bored followed by ion implanting As ions to form an $N^+$-type emitter region 114 on the surface of the internal base 108a. After this step, as shown in FIG. 9(c), an oxide film 115 is provided on the entire surface. With a known method a collector electrode 116, a base electrode 117 and an emitter electrode 118 are then formed.

This vertical NPN transistor can have a favorable ohmic contact with the base electrode 117 on the high impurity concentration ($p^+$) external base 111 while controlling the current amplification rate hFE at the low concentration ($p^-$) internal base 108a.

With respect to the vertical NPN transistor, increasing the impurity concentration at the external base 111 to lower the base resistance will result in a diffusion of P-type impurity element at the external base 111 deep into the N-type epitaxial layer in the transverse direction. Consequently the current amplification rate hFE increases in a parasitic PNP transistor in which the external base 111 serves as an emitter, an N-type epitaxial layer 103 serves as a base and a $P^+$ type isolation diffusion layer 104 serves as a collector with the result that a latch-up might occur in the operation.

As a means for preventing the latch-up, a spacing between the external base 111 and the $P^+$ type isolation diffusion region 104 (namely a base width of the above parasitic PNP transistor) is conventionally widened. Furthermore, a high concentration $N^+$ region is provided between the external base 111 and the $P^+$-type isolation diffusion region 104. In any way, a spacing between the external base 111 and the $P^+$-type isolation diffusion region is require to be widened. Such case poses a problem that the size of the transistor increases and the production cost thereof also increases.

In addition, conventional CMOS transistors are manufactured with a method shown in FIG. 12. At the outset, as shown in FIG. 12(a), on the surface of a P-type semiconductor substrate 41 N-type impurity elements are diffused in a low concentration to form an $N^-$-type (a low concentration impurity N-type) deep well 42 followed by forming an oxide film to a thickness of more than several hundred Å over the entire surface of the well. Then a silicon nitride film is deposited thereon with the Chemical Vapor Deposition (CVD) method. Then as shown in FIG. 12(b), the semiconductor substrate is subjected to patterning with the photo-etching process in such a manner that the silicon nitride film remains at a portion that will serve as an active region in the later process. This is followed by forming a Local Oxidation of Silicon (LOCOS) oxide film 43 for device isolation. Then a gate oxide film 44 is formed, ions are implanted for the control of the threshold voltage, and then a gate electrode 45 is formed, for example, with a polycrystalline silicon or the like.

In addition, as shown in FIG. 12(c), on the surface of the N- well 42, the source and drain regions of a P channel MOS transistor is subjected to patterning 46 with selfalignment. Then B (boron) ions are implanted under the conditions of acceleration energy of 20 KeV, a dose of $3 \times 10^{15}$ ions/cm$^2$ followed by forming a source region 47 and a drain 48.

Lastly, as shown in FIG. 12(d) after the source/drain regions 49 and 50 are formed with the ion implantation of As (arsenic) in the same manner, source/drain electrodes are formed respectively for the P and N channels with the known method thereby completing a CMOS transistor.

However, in conventional CMOS transistors, as shown in FIG. 12(c), a high concentration of B is ion implanted into the source and drain regions on the P channel side for lowering the resistance. Consequently, the current amplification rate hFE increases in the parasitic PNP transistor in which P+ type source/drain regions 47 and 48 serve as an emitter, the $N^-$ type well 42 serves as a base and the P-type semiconductor substrate 41 serves as a collector with the result that a latch-up mode is generated in the operation.

Then the only method currently available for preventing the latch-up is to widen a distance between the drain region 48 and the semiconductor substrate 41 (a base width in the above parasitic transistor). Such method has a disadvantage that the size of transistors inevitably enlarges and the manufacturing cost thereof increases as well.

SUMMARY OF THE INVENTION

The present invention provides a transistor comprising a p-type substrate, a N-type impurity diffusion layer and a P-type high concentration impurity diffusion layer wherein ions of an inert atom or a compound thereof are implanted in an external surface layer of the P-type high concentration impurity diffusion layer to form a crystal defect layer.

Therefore the object of the present invention is to provide a transistor and a method for manufacturing the same, the transistor being capable of suppressing hFE of the parasitic transistor and preventing the latch-up without enlarging the size of the transistor so that the transistor can operate stably at a low cost.

DESCRIPTION OF THE DRAWINGS

The present invention will be detailed in conjunction with the accompanying drawings, but they are not intended to limit the scope of the present invention.

FIG. 11 is a view showing a relation between the dose of BF2 ions and the current amplification rate hFE in the source and drain regions of the present invention.

DETAILED DESCRIPTION OF THE PREFERRED EMBODIMENTS

Figure 1A:
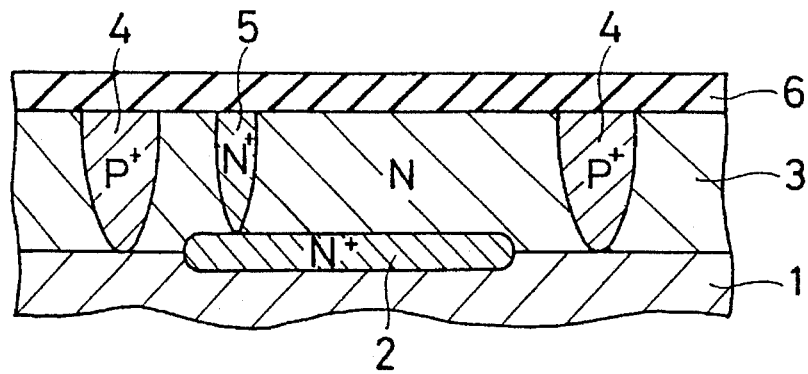
FIG. 1(a)–FIG. 1(c) are views illustrating a method for manufacturing one embodiment of a vertical transistor according to the present invention.

The present invention provides a transistor comprising a transistor region and a parasitic PNP transistor formed in the transistor region; the transistor containing at least one p-type high concentration impurity diffusion layer and a method for manufacturing the same.

Parasitic transistor are formed as a byproduct in a transistor region such as, for example, NPN transistors of vertical type, complementary transistors or the like. They are responsible for a latch-up (a phenomenon in which when a terminal voltage exceeds a certain value the whole device is fixed in the state of a low impedance) that prevents a stable operation of transistors.

The p-type high concentration impurities diffusion layer may form an external base of a vertical NPN transistor or a source and drain region on the side of a P-channel of a complementary transistor. The impurity concentration usually is about $2\times10^{15}$ to $1\times10^{16}$ ions/cm$^2$.

In accordance with the present invention, a crystal defect layer is formed in an external surface layer of the above high impurity concentration P-type layer.

The crystal defect layer is intended for decreasing the current amplification rate hFE of the parasitic PNP transistor thereby preventing a latch-up. The crystal defect layer can be obtained by implanting ions of inert atoms or a compound thereof.

Examples of the above inert atom or the compounds include F, Cl, Ar, Ne, BF, BF$_2$, BF$_3$, BCl, BCl$_2$ or BCl$_3$.

In the ion implantation, the dose of inert impurity atom or compound ions is set to a low value with an increase in their mass. For example, when F ions are used as inert ions, the dose is set to $4\times10^{15}$ ions/cm$^2$ or more, or preferably to $4\times10^{15}$ to $6\times10^{16}$ ions/cm$^2$. When BF$_2$ ions are used as the inert compound ions, the dose is set to $2\times10^{15}$ ions/cm$^2$ or more, or preferably to $2\times10^{15}$ to $2\times10^{16}$ ions/cm$^2$.

The defect layer is usually in the depth of 200 to 800 Å in the P-type high concentration impurity diffusion layer.

The foregoing section describes a vertical transistor, a complementary transistor and a method for manufacturing the same, which embody the present invention.

A vertical type transistor according to the present invention comprises a P-type substrate providing an epitaxial single crystal layer, a N-type collector layer formed in the P-type substrate, a low impurity concentration internal base provided by introducing a predetermined P-type impurity atom in the epitaxial single crystal layer on this N-type collector layer, a high impurity concentration external base provided by introducing the above P-type impurity atoms into a region surrounding the periphery of the internal base, an emitter region provided by introducing a predetermined Ntype impurity atom on the surface of the above internal base; wherein a crystal defect layer is provided by implanting ions of an inert atom or compound.

In addition a method for manufacturing a vertical transistor according to the present invention comprises the steps of introducing a predetermined P-type impurity atoms to form a low impurity concentration internal base; introducing the above P-type impurity atoms into a region surrounding the periphery of this internal base to form a high impurity concentration external base; subsequently introducing a predetermined type N-type impurity atom on the surface of the above internal base to form an emitter region; and implanting the above P-type impurity ions and ions of the inert atom or compound when the above external base is formed thereby introducing the above P-type impurity into the above region while forming a crystal defect layer.

For example, BF$_2$ ions are implanted at a dose of not less than $2\times10^{15}$ ions/cm$^2$, or preferably $2\times10^{15}$ to $2\times10^{16}$ ions/cm$^2$, followed by activating boron contained in BF$_2$ with annealing when the above external base is formed.

Still preferably, B ions are implanted at dose of not less than $2\times10^{15}$ ions/cm$^2$ and F ions are implanted at dose of not less than $4\times10^{15}$ ions/cm$^2$, or preferably in the range of $4\times10^{15}$ to $6\times10^{16}$ ions/cm$^2$ followed by annealing implanted B ions at 1000° C. or less for activation.

When a crystal defect layer is formed on a surface of a crystal structure of the P-type high concentration impurity diffusion layer the presence of the crystal defect layer lowers the emitter injection efficiency of a parasitic transistor having the above external base as an emitter thereof. Thus the current amplification hFE of the above parasitic PNP-type transistor lowers to terminate the generation of latch-up thereby stabilizing the operation of the transistor. Furthermore, since the size of the transistor itself is not enlarged, the production cost does not increase. Consequently, the vertical transistor according to the present invention is manufactured at a cost lower than conventional transistors. Incidentally, the above crystal defect layer is formed in a region of vertical transistors, such transistor does not exhibit increase leakage current between the collector and emitter or leakage current between the collector and base.

Figure 5:
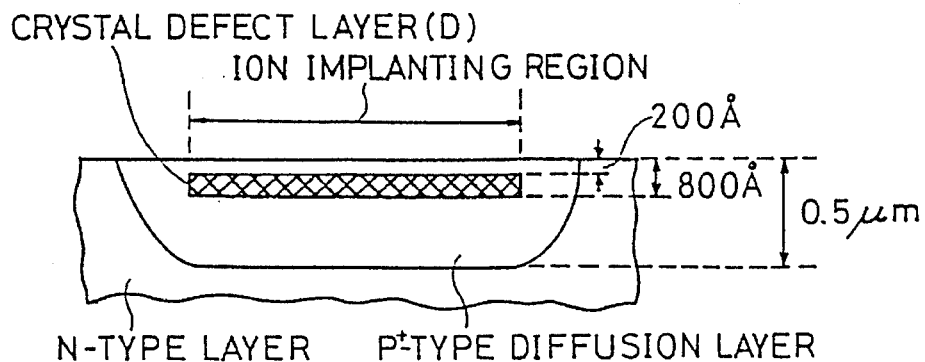
FIG. 5 is a view schematically showing a state in which a defect layer is formed on the surface of a P+-type diffusion layer.
Figure 6:
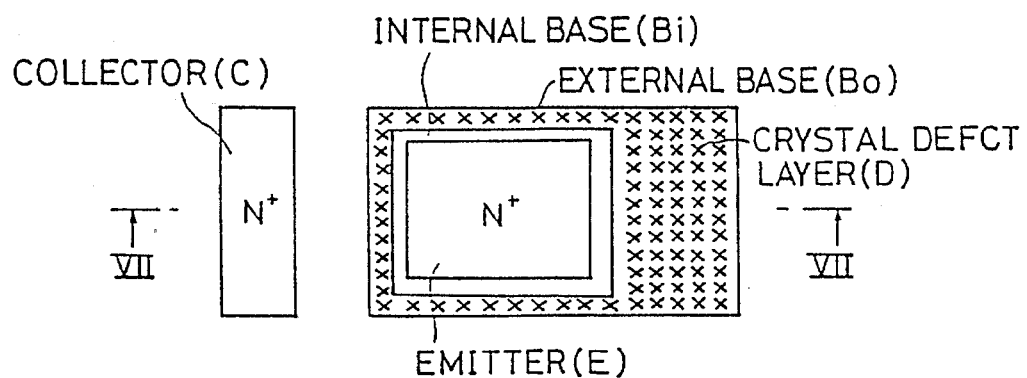
FIG. 6 is a view showing an essential part of a pattern in the vertical type transistor to be manufactured.
Figure 7:
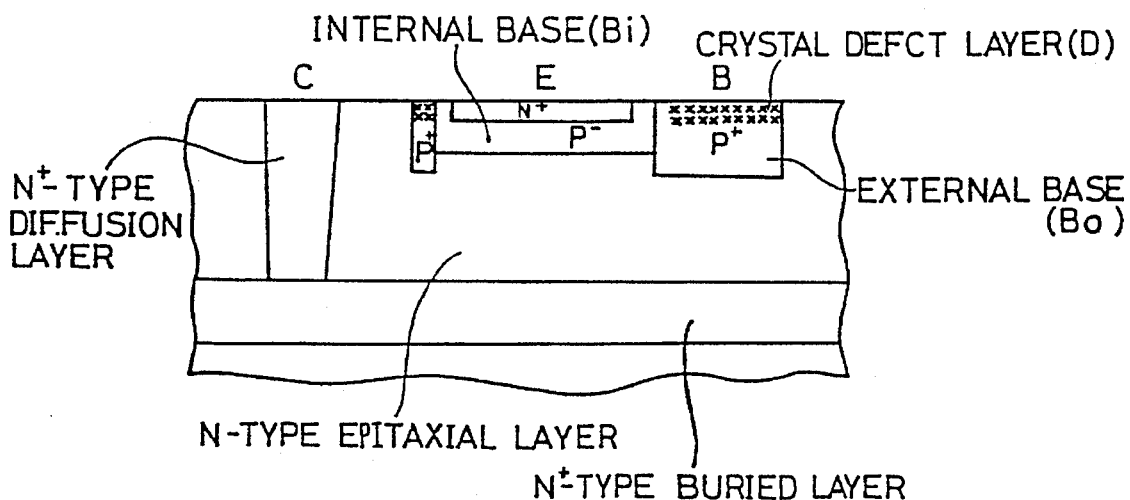
FIG. 7 is a view showing an essential part of the cross section of the vertical type transistor to be manufactured.
Figure 8A:
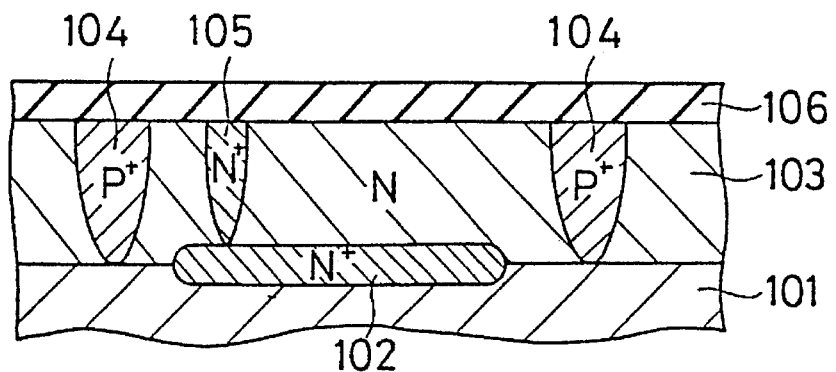
FIG. 8(a)–FIG. 8(c) are a view illustrating a method for manufacturing a conventional vertical transistor.
Figure 8B:
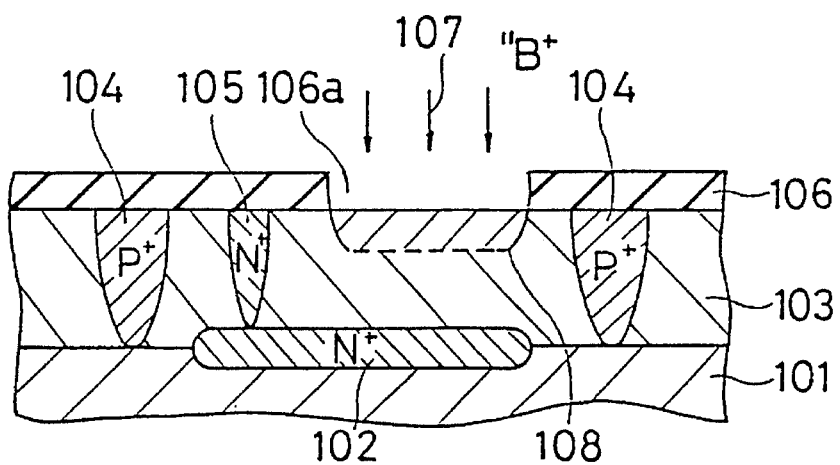
Figure 8C:
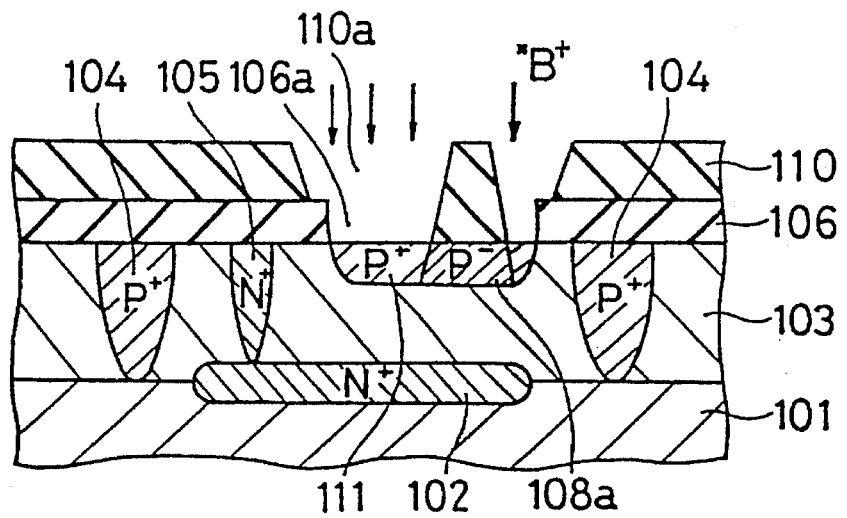
Figure 9A:
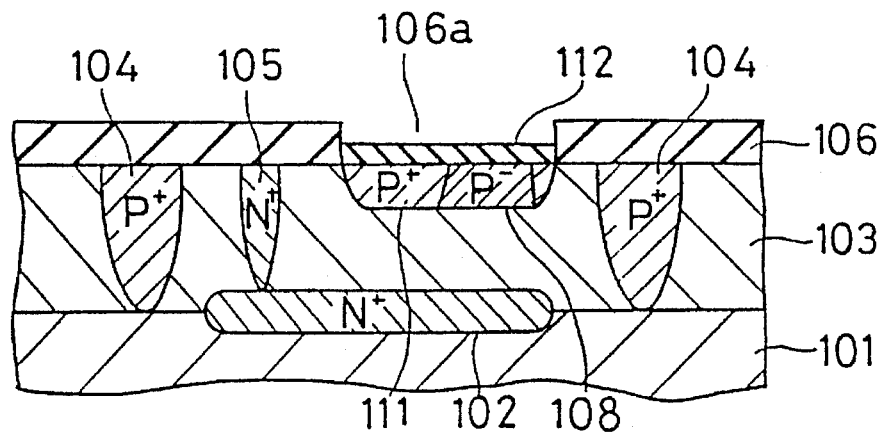
FIG. 9(a)–FIG. 9(c) are a view illustrating a method for manufacturing a conventional vertical transistor.
Figure 9B:
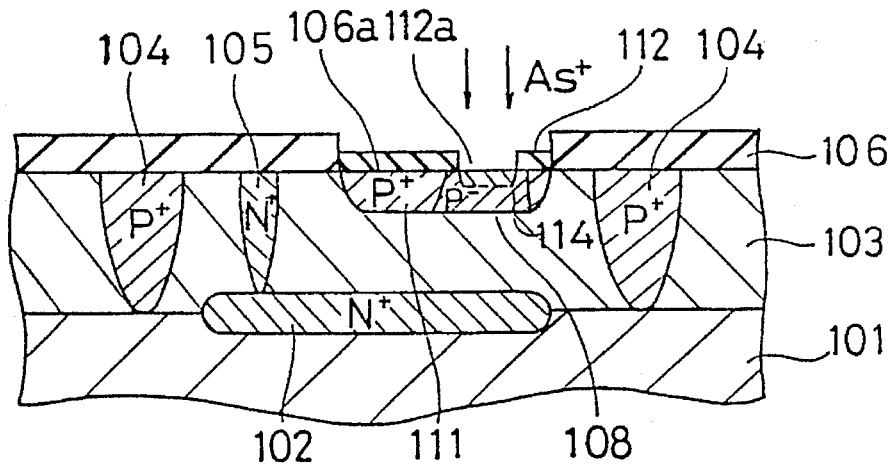
Figure 9C:
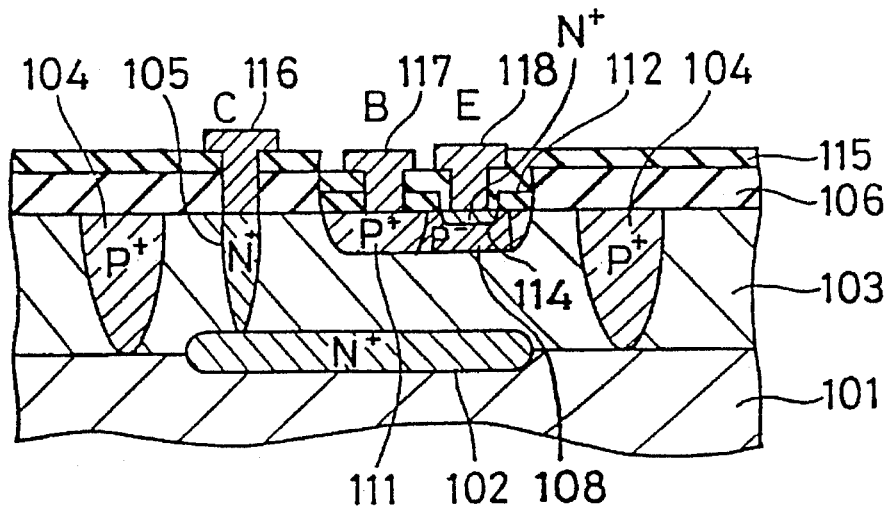

When for example $BF_2$ ions are implanted in a dose of $2 \times 10^{15}$ ions/cm$^2$ or more on a surface of an external base ($P^+$-type diffusion) layer, the $BF_2$ ions implantation region on the $P^+$ type diffusion layer is made amorphous. Then annealing the region at a predetermined temperature (mentioned later) is effected to form a defect layer D of crystal structure on the interface between the $P^+$ type diffusion layer and amorphous as shown in FIG. 5.

Figure 3:
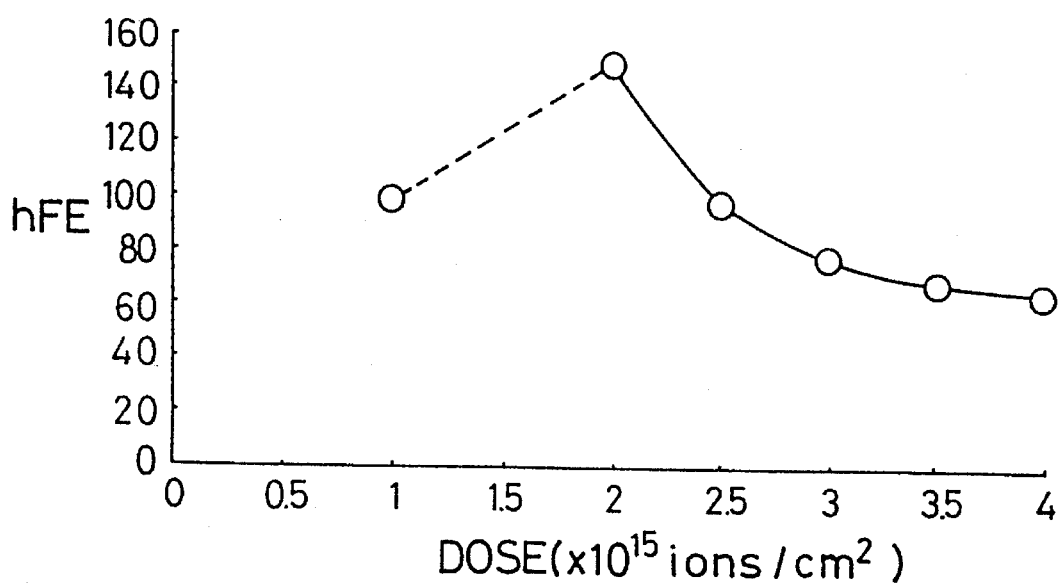
FIG. 3 is a view showing a relation between a dose in an external base region and hFE in a parasitic PNP transistor according to the present invention.
Figure 4:
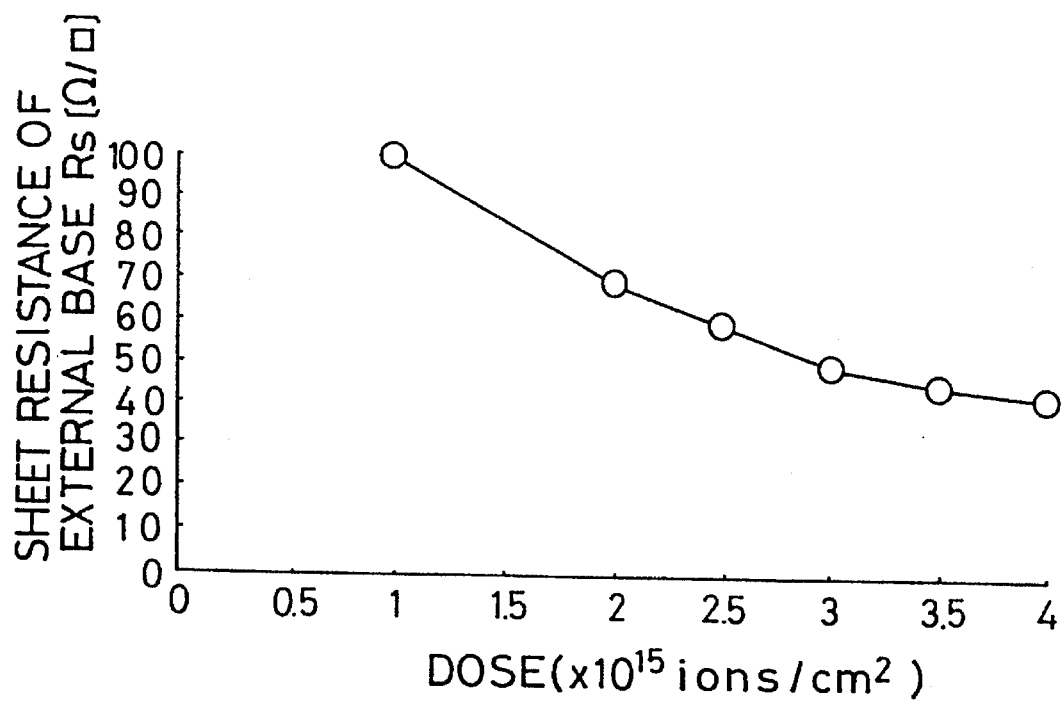
FIG. 4 is a view showing a relation between the dose in the external base region and a sheet resistance.

FIG. 3 shows a relation between the dose and the current amplification rate hFE of the parasitic PNP transistor. In addition, FIG. 4 shows a relation between the above dose and the sheet resistance R2 of the external base $B_0$. As apparent from FIG. 3, the current amplification rate hFE drops along with an increase in the impurity concentration in a region having a dose of $2 \times 10^{15}$ or more (the current amplification rate hFE increases along with an increase in the impurity concentration). It is possible to think that this is attributed to the generation of a crystal defect layer D in the external base $B_0$. As shown in FIG. 5, when the acceleration energy of ion implantation assumes 30 keV, the depth of the crystal defect layer D assumes 200 to 800 Å. In addition, as can be seen from FIG. 4 when the dose increases, the sheet resistance Rs value reduces. However, even when the dose is set to more than $2 \times 10^{16}$ ion/cm$^2$ or more, the sheet resistance does not drop owing to the relation of solid solution limit relative to a single crystal N-type collector layer (usually Si). Consequently, the dose of $BF_2$ ions is set within the range of $2 \times 10^{15}$ to $2 \times 10^{16}$ ions/cm$^2$.

Furthermore, after the ion implantation, implanted impurities are annealed after usage to active them. Inventors of the present invention have confirmed that the crystal defect layer D remains on the external base $B_0$. However, as a matter of fact, the implanted ions are annealed at 700° to 1000° C. to activate them.

Still furthermore, when boron and fluorine are individually ion implanted, a crystal defect layer is formed in the neighborhood of the surface of the external base in the same manner as in the case of $BF_2$. However, F ions are small in the mass number compared with $BF_2$. Thus forming a crystal defect layer equal to $BF_2$ requires the dose twice or three times larger than in the case of $BF_2$. Incidentally the annealing temperature may be set to the range of 700° to 1000° C. as in the case of $BF_2$.

A complementary transistor according to the present invention comprises a P-type substrate, a N-type well provided by introducing a predetermined N-type impurity element on the surface of this substrate, a P-type source region and a drain region spaced apart from each other by introducing a predetermined P-type impurity element into this well, a gate electrode formed in such a manner that it extends from the drain region over to the source region with an insulating film sandwiched the above two regions and the gate electrode, wherein a defect layer of a crystal structure is provided by implanting ions of inert impurity atoms or ions of their compounds.

In addition, a method for manufacturing a complementary transistor according to the present invention comprises the steps of:

introducing a predetermined N-type impurity element on the surface of a P-type substrate to form an N-type well; introducing a predetermined P-type impurity atom to form a drain and a source region spaced apart from each other; and subsequently forming a gate electrode on the surface of the well so that it extends from the source region over to drain region with an insulating film sandwiched between the two regions and the gate electrode; wherein when the above drain and the source region are formed, the above ions of P-type impurity atoms and the inert atoms or the ions of the compounds thereof are implanted on the surface of the well and a crystal defect layer is formed.

Otherwise, the above comprises the steps; introducing a predetermined N-type impurity element on the surface of a P-type substrate to form an N-type well; forming a gate electrode on the surface of the well followed by forming an insulating film on the well; subsequently introducing a predetermined P-type impurity atom into the well to form a drain and a source region spaced apart from each other; wherein when the above drain and the source region are formed, the above ions of P-type impurity atoms and the inert atoms or the ions of the compounds thereof are implanted on the surface of the well and a crystal defect layer is formed.

Incidentally, when the above drain and the source regions are formed, as ions of the compounds of P-type impurity and inert atoms, $BF_2$ ions are implanted in the dose of $5 \times 10^{15}$ ions/cm$^2$ or more, or preferably $5 \times 10^{15}$ to $2 \times 10^{16}$ ions/cm$^2$ followed by annealing boron contained in $BF_2$ at 1000° C. or less, or preferably 1000° to 700° C. activate it.

In the crystal defect layer provided by introducing into the source and the drain region of the complementary transistor inert impurity atom ions or ions of inert impurity atom compounds from the surface, electrons are recombined in operation which have been injected into a parasitic transistor with the source and the drain region serving as an emitter. Consequently, the current amplification rate hFE of the above parasitic PNP transistor decreases to eliminate the generation of latch-up in the operation thereby stabilizing the operation thereof. In addition, the distance between the source/drain region and the semiconductor substrate are not widened with the result that the size of the transistor does not become larger. Thus an increase in the manufacturing cost can be suppressed.

In the manufacturing method of the complementary transistor, when ions are implanted from the well surface which contain P-type impurity elements and inert impurity elements in the composition thereof, the crystal structure in the neighborhood of well surface changes from a single crystal to amorphous. When heat treatment is performed, a crystal defect layer is formed on the interface between the above single crystal and the amorphous. The crystal defect layer serves to decrease the current amplification rate hFE of the parasitic transistor to prevent the latch-up in operation thereby reducing the manufacturing cost without increasing the size of the transistor.

When $BF_2$ ions are implanted in the dose of $5 \times 10^{15}$ ions/cm$^2$ or more, or preferably $5 \times 10^{15}$ to $2 \times 10^{16}$ ions/cm$^2$, the region in the neighborhood of the well surface is converted into an amorphous state. Subsequently when the well surface is annealed at 1000° C. or less, or preferably 700° to 1000° C., a crystal defect layer is formed on the interface between the well and the single crystal.

The foregoing section will detail in conjunction with embodiments a vertical transistor and a complementary transistor as well as a method for manufacturing the same according to the present invention.

Example 1

A method for manufacturing a vertical NPN transistor shown in FIG. 2(c) will be detailed hereinbelow. The vertical NPN transistor comprises an internal base 8 with a low impurity concentration provided on the surface of a collector layer 3, an external base 11 with a high impurity concentration provided in a region surrounding the periphery of this internal base 8, an emitter region 14 provided on the surface of the internal base 8.

(1) At the outset, as shown in FIG. 1(a), an $N^+$-type buried layer 2 is provided on a predetermined region of the surface of a P-type semiconductor substrate 1. This $N^+$-type buried layer 2 is formed by ion implanting Sb ions at an acceleration energy of 60 keV in the dose of $3 \times 10^{15}$ ions/cm$^2$ through an oxide film not shown in the drawings followed by 500 minutes annealing for activation at 1150° C. in the atmosphere of $N_2$. Then an N-type epitaxial layer 3 having a thickness of 3.0 μm and a specific resistivity of 1Ω·cm is formed on the entire surface of the semiconductor substrate 1. Then a $P^+$-type isolation diffusion layer 4 reaching the semiconductor substrate 1 is formed. This $P^+$-type isolation diffusion layer 4 is formed by ion implanting $^{11}$B ions at an acceleration energy of 80 keV in the dose of $3 \times 10^{15}$ ions/cm$^2$ on an N-type epitaxial layer on which an oxide film not shown in the drawings through the oxide film followed by 300 minutes annealing for activation at 1150° C. in the atmosphere of $N_2$. Then on the upper part of the $N^+$-type buried layer out of the epitaxial layer 3 an $N^+$-type diffusion layer 5 is formed. This $N^+$-type diffusion layer 5 is formed by ion implanting $^{31}$p ions at an acceleration energy of 80 keV and in the dose of $4 \times 10^{15}$ followed by 180 minutes annealing for activation at 1000° C. in the atmosphere of $N_2$. Then about 3000 Å thick oxide film 6 is formed with 80 minutes heat treatment at 900° C. in the atmosphere of $H_2O$. A collector layer is constituted with this N+ diffusion layer 5, the $N^+$ type buried layer 2 and the N-type epitaxial layer 3.

Figure 1B:
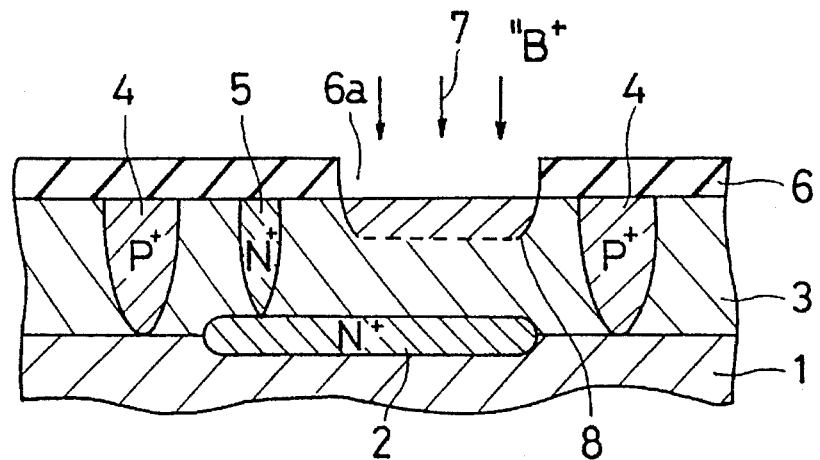

(2) Subsequently, as shown in FIG. 1(b), an opening 6a is bored over part of the $N^+$ diffusion layer 2 out of the oxide film 6 with photolithography and etching. Then $^{11}$B ions (designated by Reference Numeral 7) are implanted at an acceleration energy of 50 KeV and in the dose of $3 \times 10^{13}$ ions/cm$^2$ through this opening 6a thereby forming an active base 8 of $P^-$-type.

Figure 1C:
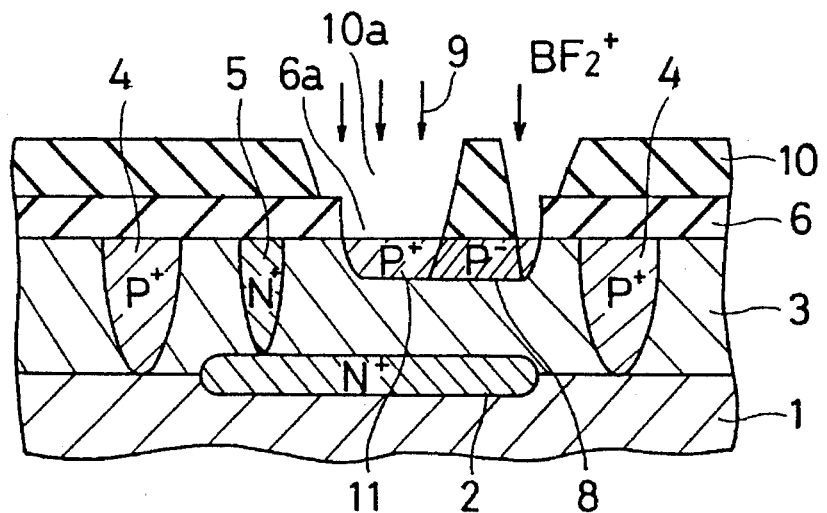

(3) Then, as shown in FIG. 1(c), a resist 10 is applied on the surface side of the semiconductor substrate 1 followed by performing photolithography to bore an opening 10a in a region corresponding to the periphery of the active base 8 out of the resist 10. Through this opening 10a $BF_2$ ions (designated by Reference Numeral 9) are implanted at an acceleration energy of 30 KeV and in the dose of $3 \times 10^{15}$ ions/cm$^2$ to form an external base 11 of $P^+$-type on the periphery of the active base 8. (Incidentally the portion where $P^-$-type remains out of the active base 8 is referred to as an "internal base" 8a).

Figure 2A:
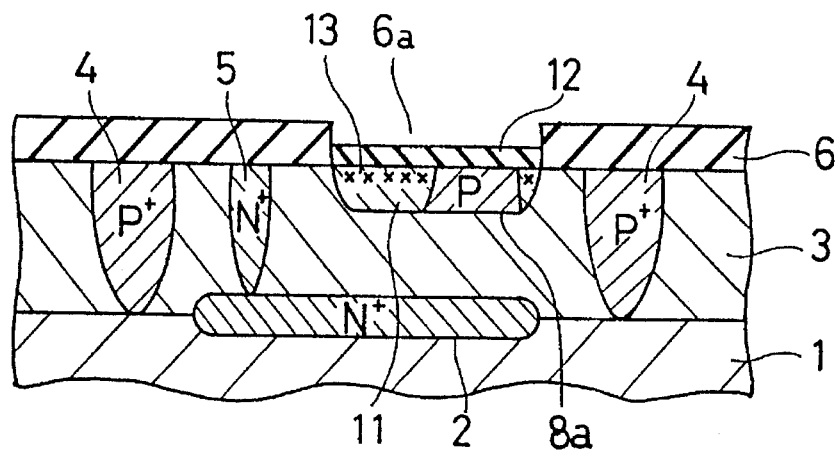
FIG. 2(a)–FIG. 2(f) are additional views illustrating a method for manufacturing one embodiment of a vertical transistor according to the present invention.

(4) After the resist 10 is removed, as shown in FIG. 2(a), impurities implanted into the external base 11 is subjected to 60 minutes annealing for activation at 950° C. in the atmosphere of $N_2$ followed by 80 minutes heat treatment at 900° C. in the atmosphere of $O_2$. Thus about 300 Å thick oxide film 12 is formed on the opening 6a and a crystal defect layer 13 is formed to the depth of 200 to 800 Å from the surface of the external base 11.

Figure 2B:
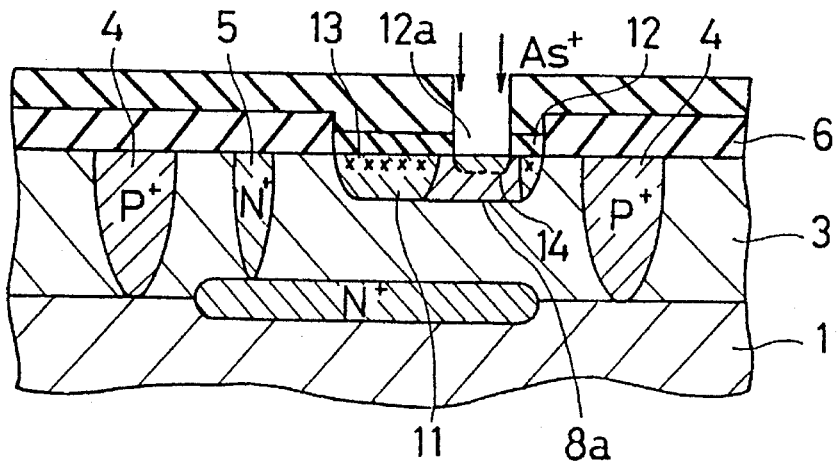

(5) Then, as shown in FIG. 2(b), after an opening 12a is bored in a portion corresponding to the upper portion of the internal base 8a out of the oxide film 12, As ions are implanted through this opening 12a at an acceleration energy of 50 KeV and in the dose of $5 \times 10^{15}$ ions/cm$^2$ thereby forming an $N^+$-type emitter region 14 on the surface of the internal base 8a.

Figure 2C:
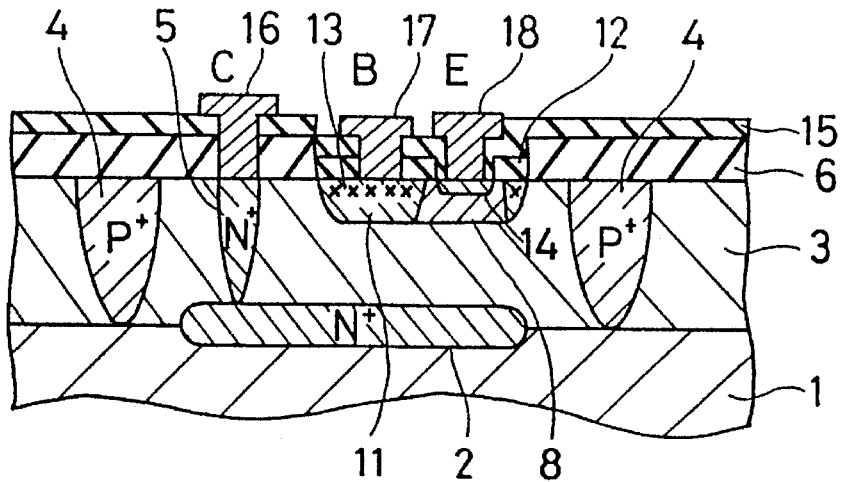
Figure 2D:
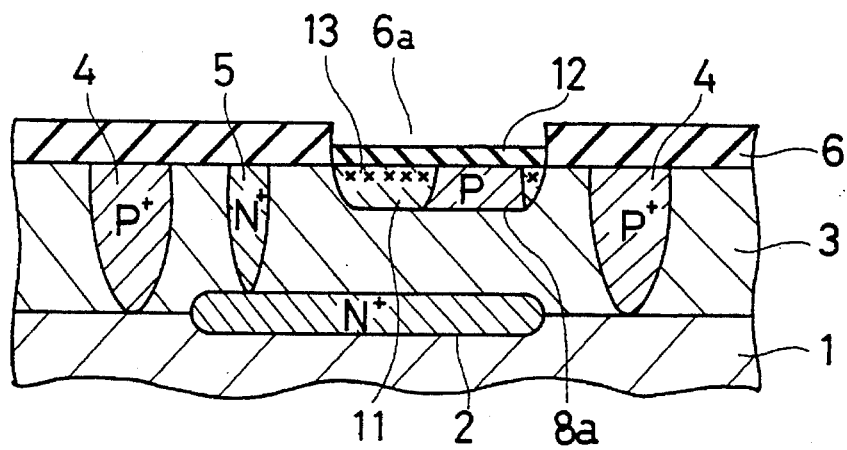
Figure 2E:
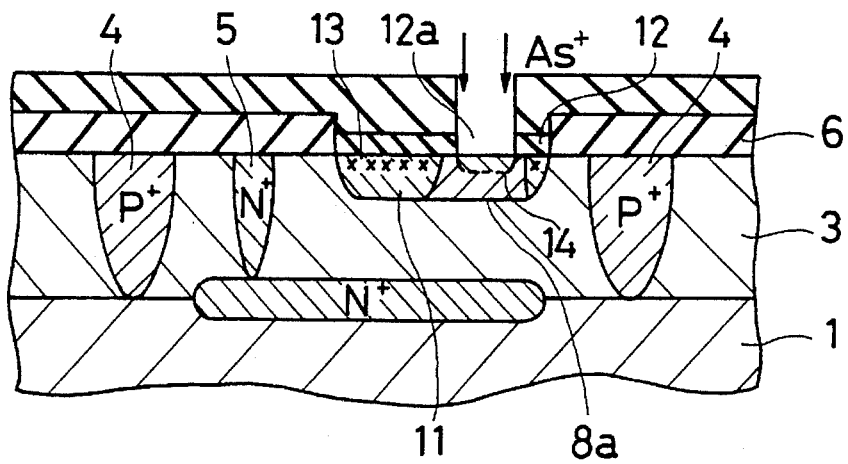
Figure 2F:
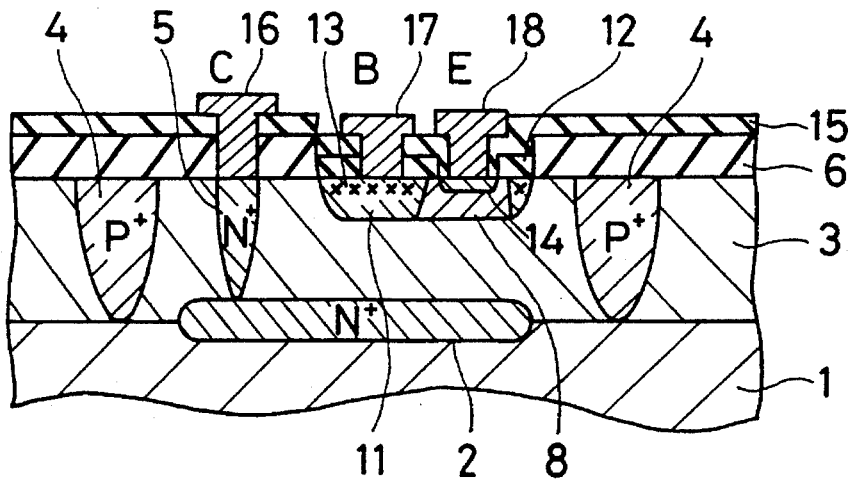

(6) After that, as shown in FIG. 2(c), an oxide film 15 having a thickness of about 4000 Å is provided over the entire surface of the substrate with the CVD process. This is followed by 60 minutes annealing at 920° C. in the atmosphere of $N_2$. In the last process, a collector electrode 16, a base electrode 17 and an emitter electrode 18 are formed with the known method.

Thus, with reference to this NPN vertical transistor, $BF_2$ ions are implanted on the surface of the external base 11 to form the defect layer 13. The presence of the defect layer 13 allows the reduction of the efficiency of the emitter injection of a parasitic PNP transistor comprising the above external base 11 serving as an emitter, the N-type epitaxial layer serving as a base and the $P^+$-type isolation diffusion layer 4 serving as a collector. Thus the current amplification rate hFE of the above parasitic transistor can be reduced. Consequently the vertical NPN transistor ceases to generate a latch-up in operation and operates in a stable state. In addition the size of the transistor remains the same instead of being enlarged thereby eliminating the need of increasing the production cost. Thus this NPN vertical transistor can be manufactured at a low cost compared with conventional transistors. Incidentally the above defect layer 13 is formed in the external base 11, the leakage current between the collector and emitter and the leakage current between the collector and base does not increase.

Incidentally, in the above process (3), $^{11}$B ions and F ions may be used in the place of $BF_2$ ions. For example, $^{11}$B ions are implanted at an acceleration energy of 10 KeV and in the dose of $3 \times 10^{15}$ ions/cm$^2$, which is followed by implanting F ions at an acceleration energy of 15 KeV and in the dose of $3 \times 10^{15}$ ions/cm$^2$. In this case, like the case of $BF_2$, the defect layer 13 is formed on the surface of the external base 11, thereby stabilizing the operation of the NPN transistor. Incidentally, the order of implanting $^{11}$B ions and F ions may be changed. As apparent from the above description, the vertical transistor according to the present invention comprises a single crystal N collector layer, a low concentration internal base provided by introducing a predetermined P-type impurity element on the surface of this N-type collector layer and a high concentration impurity provided by introducing the above P-type into a region surrounding the periphery of this internal base and an emitter region provided by introducing a predetermined N-type impurity element on the surface of the above internal base wherein a defect layer is provided by implanting ions including inert impurity element ions or inert impurity element composition on the surface of the above external base. Thus this prevents the generation of a latch-up in operation and the transistor can be operated in a stable state. In addition, since the size of the transistor is not enlarged, the cost does not increase. Compared with conventional transistors, the transistor of the present invention can be manufactured at a low cost.

Example 2

Figure 10A:
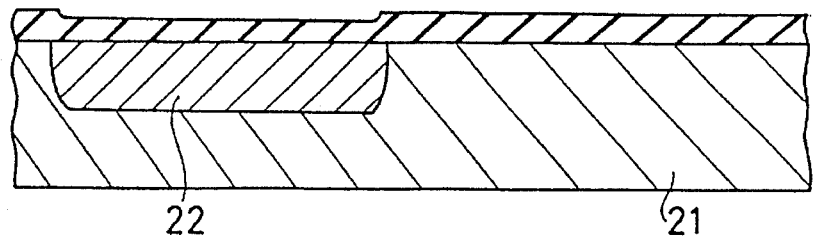
FIG. 10(a)–FIG. 10(d) are a longitudinal sectional view showing an embodiment of a method for manufacturing a complementary transistor of the present invention.
Figure 10B:
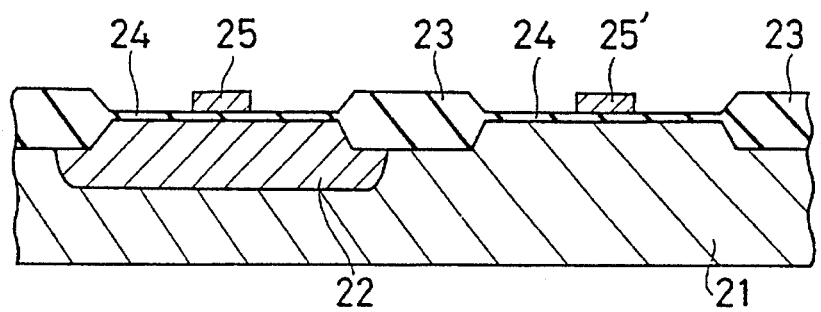
Figure 10C:
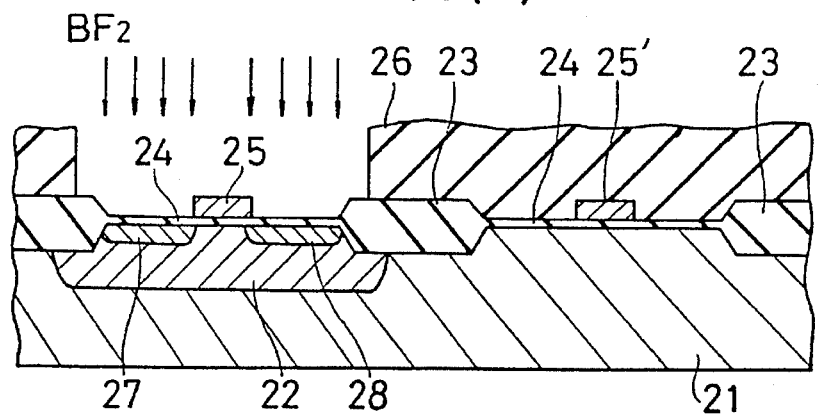
Figure 10D:
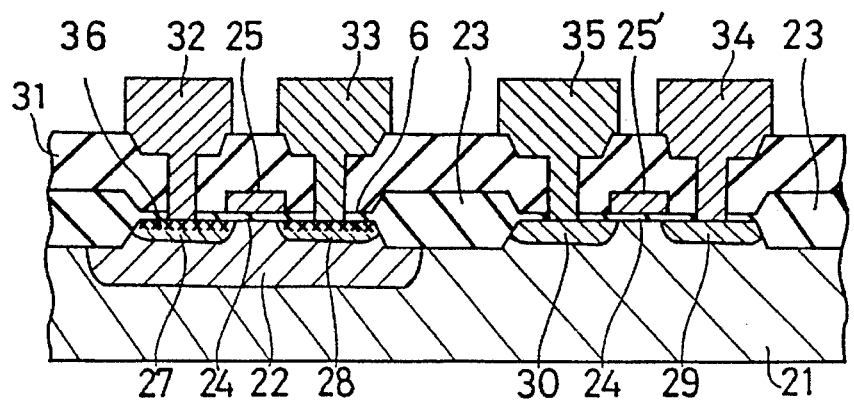
Figure 12A:
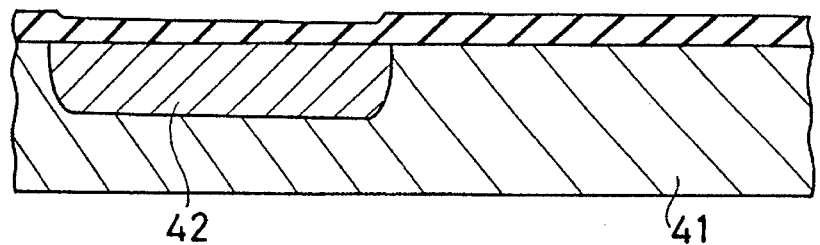
FIG. 12(a)–FIG. 12(d) are a longitudinal sectional view showing a method for manufacturing a conventional complementary transistor.
Figure 12B:
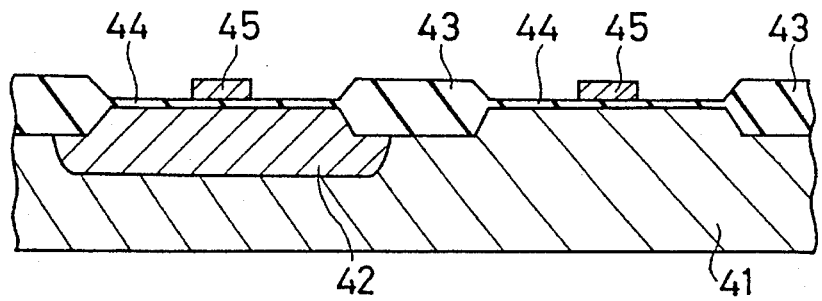
Figure 12C:
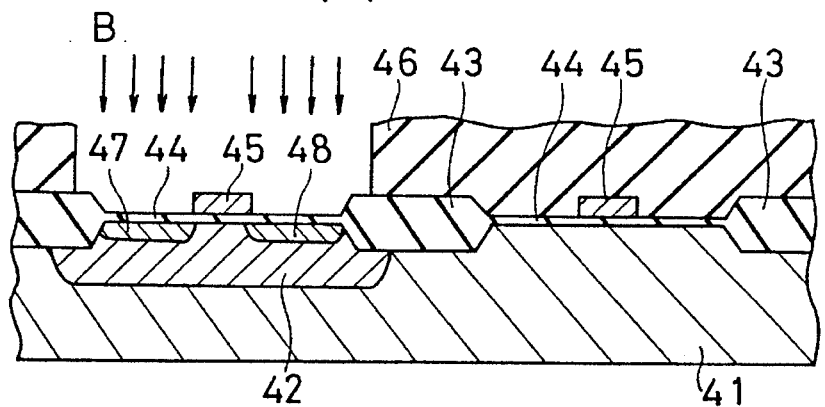
Figure 12D:
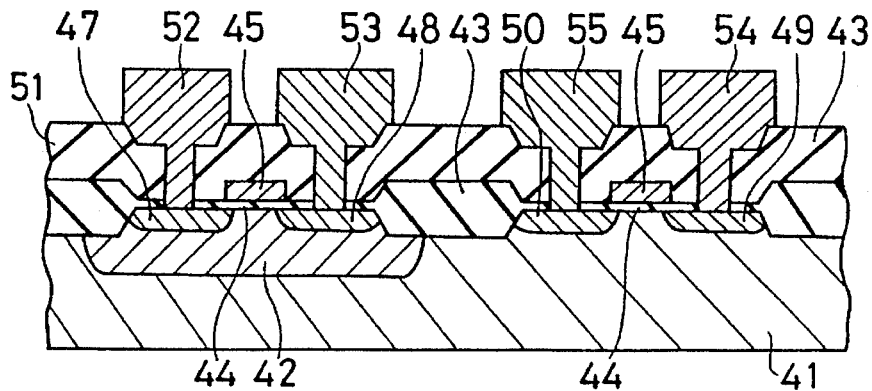

FIG. 10(d) is a longitudinal sectional view showing one embodiment of a complementary transistor according to the present invention. This CMOS transistor has the same construction as the transistor shown in FIG. 12(d) except that the composition and the structure of the source/drain region in the well 22 is different. Corresponding parts are designated by Reference Numerals minus 20 from Reference Numerals in FIG. 12(d).

In other words, referring to FIG. 10(d) Reference Numeral 21 designates a P-type semiconductor substrate, 22 an N⁻ type well formed by diffusing an N-type impurity elements on the surface of this substrate 21, 23 a LOCOS oxide film for device isolation, 24 a gate oxide film, 25 a gate electrode formed of polycrystalline silicon on the gate oxide film 24, 27 and 28 P⁺ type source and drain regions formed by ion implanting $BF_2$ ions on both sides of the surface of the well 22, said regions having respectively a defect layer 36 by annealing in the neighborhood of the surface. A P-channel MOS transistor is formed of the above gate electrode 25, and source and drain regions 27 and 28.

Furthermore, Reference Numerals 29 and 30 designate a source and drain region formed on the surface of the semiconductor substrate 21 adjacent the above P-channel MOS transistor. A gate electrode 25' has a source region and a drain region formed on the opposite side by ion implanting As ions. This gate electrode 25' and the source and the drain region 29 and 30 constitute an N-channel MOS transistor.

Incidentally, Reference Numerals 32 and 33 designate a source and drain electrodes formed in such a manner that they contact the source and drain regions 27 and 28 on the P-channel side. Reference Numerals 34 and 35 designate a source and drain electrodes formed in such a manner that they contact the source and drain regions 29 and 30 on the N-channel side.

A method for manufacturing a CMOS transistor with the above construction will be described hereinbelow. The method is different from the conventional method described in only in that $BF_2$ ions are used for ion implantation shown in FIG. 10(c) followed by annealing.

At the outset, as shown in FIG. 10(a), an N-type impurity element is diffused in a low concentration on the surface of the P-type semiconductor substrate 21 to form a deep N⁻-type well 2. Then an oxide film is formed on the entire surface of the substrate 21 to a thickness of several hundred angstroms which is followed by the deposition of silicon nitride film thereon with the CVD process. Subsequently, as shown in FIG. 10(b), the substrate is subjected to patterning with a photoetching process so that the silicon nitride film remains at a portion which will become a LOCOS oxide film 23 for device isolation. Subsequently a gate oxide film 24 is formed which is followed by ion implantation for the threshold voltage control and then a gate electrode 25, 25' is formed with a polysilicon or the like.

In the next step, as shown in FIG. 10(c) the source and the drain region of a P-channel MOS transistor are subjected to patterning on the surface of the N⁻ type well 22 with selfalignment. Referring to FIG. 10(c), $BF_2$ ions are implanted as shown by an arrow under the condition of acceleration energy of 30 KeV and the dose of $5\times10^{15}$ ions/cm² to form the source and drain regions 27 and 28, thereby forming a P-channel MOS transistor.

In the last step, as shown in FIG. 10(d), the source and the drain region of the N-channel MOS transistor are formed in the same manner by implanting As ions with a LOCOS oxide film 23 sandwiched between the two regions. This is followed by forming an oxide film 31 on the entire surface of these regions. Then the oxide film 31 is subjected to 30 minutes annealing in the atmosphere of $N_2$ ions at 800° to 1000° C. Then a source electrodes 32, 34 and a drain electrodes 33, 35 are formed for P- and N- channels with a known method thereby completing a CMOS transistor.

The above step of implanting BF2 ions changes the crystal structure in the neighborhood of the surface of the well 22, for example, from a single crystal to an amorphous structure. Then the subsequent process of annealing activates impurity of B ions to form a defect layer on the interface between the single crystal and the amorphous structure. Incidentally, the annealing temperature is set to the range of 800° to 1000° C. This is because the temperature range is suitable for forming the defect layer 36.

In the CMOS transistor thus manufactured, a defect layer 36 is formed in the neighborhood of the surface of the source and drain regions 27 and 28 on the P-channel side. Consequently, the CMOS transistor is characterized by the operation in which electrons are recombined at the defect layer 36 which are injected into a parasitic PNP transistor comprising the above source and drain regions 27 and 28 serving as an emitter, the well 22 serving as a base and the semiconductor substrate 21 serving as a collector, thereby causing an increase in a recombination current and a decrease in the efficiency of emitter injection. Consequently, the current amplification rate hFE is lowered in the above parasitic PNP transistor to terminate the generation of the latch-up in operation which stabilizes the operation of the transistor. In addition, the distance between the source and drain regions 27 and 28 and the semiconductor substrate 1 is not widened. Thus the size of the transistor is not enlarged and the cost of production can be suppressed.

FIG. 11 shows a relation between the dose at the ion implantation and the current amplification rate hFE of the parasitic transistor under the condition of a certain value (30 KeV) of acceleration energy. As can be seen from FIG. 11, along with an increase in the dose of $BF_2$ the defect layer increases whereas the current amplification rate hFE decreases. When the dose assumes $5\times10^{15}$ ions/cm² the current amplification rate hFE assumes approximately 70, which poses no problem in practical usage. In addition, when the dose assumes $5\times10^{15}$ ions/cm² or more, the resistance in the source and drain regions 27 and 28 on the P-channel side becomes sufficiently low, assuming 120 Ω/□ in terms of sheet resistance value. Thus a favorable P-channel MOS transistor, and still more the properties of a CMOS transistor can be realized.

In the above embodiment of a method for manufacturing a CMOS transistor, $BF_2$ ions are implanted into the well. In place of $BF_2$ ions, B ions and F ions can be used for manufacturing a complementary transistor. For example, B ions are implanted under the condition of acceleration energy of 10 KeV and the dose of $5\times10^{16}$ followed by implanting F ions under the condition of acceleration energy of 15 KeV and the dose of $1\times10^{16}$ ions/cm². In this case, like in the case of $BF_2$ ions, a defect layer can be formed, and the operation of the P-channel MOS transistor can be stabilized.

Furthermore, ion seeds for forming the above defect layer are not restricted to the embodiment. Any of F, Cl, Ar, Ne, BF, $BF_3$, BCl, $BCl_2$ and $BCl_3$ can be used. However, the dose of ion implantation is set in accordance with the mass number of adopted ions.

As is made clear in the above explanation, a complementary transistor according to the present invention has a P-type substrate, an N-type well provided on the surface of this substrate, a P-type source and drain region provided on the surface of the well with a spacing therebetween, a gate electrode provided on the surface of the well between two regions via an insulating film. On the surface of the above source region and the drain region, inert impurity element ions or ions including inert impurity elements are implanted and the defect layer is provided. Thus without widening a distance between the source and drain region and the substrate, an emitter implantation efficiency of a parasitic PNP transistor is lowered which comprises the above source and drain region serving as an emitter, the well serving as a base and the substrate serving as a collector. Consequently the current amplification rate can be lowered. Thus the generation of the latch-up can be prevented from occurring in operation while suppressing the enlargement of the size of the transistor and an increase in the cost of production so that can be stabilized in operation.

What is claimed is:

1. A transistor comprising
    a P-type substrate,
    an N-type impurity layer, and
    a P-type high concentration impurity diffusion layer formed in the N-type impurity layer, wherein the P-type high concentration impurity diffusion layer has a crystal defect layer formed therein by implanting ions of an inert atom or a compound thereof, said crystal defect layer being located at the entire bottom surface of an amorphous layer formed by the implantation and lowering the current amplification rate of a parasitic transistor having the P-type high concentration impurity diffusion layer serving as an emitter.

2. A transistor of claim 1 in which the P-type substrate comprises an epitaxial single crystal layer; the N-type impurity layer is a N-type collector layer formed on the P-type substrate having the epitaxial single crystal layer; the N-type impurity layer has the P-type high concentration impurity diffusion layer as an external base formed in the peripheral area of a P-type low concentration impurity diffusion layer as an internal base; and an emitter region is formed on the surface of the internal base.

3. A transistor of claim 1 in which the N-type impurity diffusion layer is formed as a well in the P-type substrate, the P-type high concentration diffusion layer is formed as a pair of source and drain regions with a space in said well, a gate electrode is formed on the surface of said well, and between the source and drain region.

4. A transistor of claim 1 wherein the inert atom or compound is F, Cl, Ar, Ne, BF, $BF_2$, $BF_3$, BCl, $BCl_2$ or $BCl_3$.

5. A transistor of claim 1 wherein the inert atom is F atom which is implanted at a dose of $4 \times 10^{15}$ to $6 \times 10^{16}$ ions/$cm^2$.

6. A transistor of claim 1 wherein the inert compound is $BF_2$ which is implanted at a dose of $2 \times 10^{15}$ to $2 \times 10^{16}$ ions/$cm^2$.

7. A transistor of claim 1 wherein the crystal defect layer is formed in a depth of 200 to 800 Å in the external surface layer of the P-type high concentration impurity diffusion layer.

8. A transistor of claim 1 wherein the P-type high concentration impurity diffusion layer and the crystal defect layer are formed by implanting P-type impurity ions and the inert atom or compound ions, followed by annealing.

9. A transistor of claim 8 wherein the implantation is conducted by using B ions at a dose of $2 \times 10$ or more ions/cm2 and F ions at a dose of $4 \times 10^{15}$ or more ions/$cm^2$.

10. A transistor of claim 8 wherein the implantation is conducted by using $BF_2$ ions at a dose of $2 \times 10^{15}$ or more ions/$cm^2$.

11. A transistor of claim 8 wherein the annealing is conducted at a temperature of 700°–1000° C.

12. A transistor according to claim 1, in which the crystal defect layer is formed throughout in the depth of 200 to 800 Å in the planar direction of the surface of the substrate.

13. A transistor as in claim 2 further including a P-type region formed in the N-type impurity layer and capable of operating as a collector of the parasitic transistor.

14. A semiconductor device comprising:
    a P type substrate;
    an N type layer on said substrate and forming a PN junction therewith;
    a P type region of high impurity concentration formed in said N type layer and serving as the emitter of a parasitic PNP transistor formed by the P type region, N type layer and P type substrate;
    said P type region being single crystalline and including entirely within its boundaries an amorphous layer formed by the implantation of ions of an inert atom or a compound of the inert atom; and
    a crystal defect layer at the interface of the amorphous layer and the single crystalline P type region which reduces the current amplification rate of said parasitic PNP transistor.

15. A semiconductor device comprising:
    an N type layer;
    a P type component isolation diffusion formed in said N type layer and forming a PN junction therewith;
    a P type region of high impurity concentration formed in said N type layer and serving as the emitter of a parasitic PNP transistor formed by said P type region, N type layer and P type isolation diffusion;
    said P type region being single crystalline and including entirely within its boundaries an amorphous layer formed by an implantation of ions of an inert atom or a compound of the inert atom; and
    a crystal defect layer at the interface of the single crystalline P type region and the amorphous layer, which defect layer reduces the current amplification rate of said parasitic PNP transistor.

16. A semiconductor device as in claim 14 wherein the implantation is followed by annealing at a temperature of 700° to 1000° C.

17. A semiconductor device as in claim 15 wherein the implantation is followed by annealing at a temperature of 700° to 1000° C.

* * * * *